United States Patent
Duggal et al.

(10) Patent No.: US 6,700,322 B1
(45) Date of Patent: Mar. 2, 2004

(54) LIGHT SOURCE WITH ORGANIC LAYER AND PHOTOLUMINESCENT LAYER

(75) Inventors: Anil Raj Duggal, Niskayuna, NY (US); Alok Mani Srivastava, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 375 days.

(21) Appl. No.: 09/592,045

(22) Filed: Jun. 12, 2000

Related U.S. Application Data

(60) Provisional application No. 60/194,068, filed on Mar. 31, 2000, and provisional application No. 60/178,451, filed on Jan. 27, 2000.

(51) Int. Cl.[7] ........................ H05B 33/00; H05B 33/10; H05B 33/02
(52) U.S. Cl. ........................ 313/504; 313/503; 313/506; 313/507; 313/501; 428/690; 428/917; 427/66; 445/24; 252/301.4 R; 252/301.4 F; 252/301.45
(58) Field of Search ................... 252/301.4 R, 301.4 F, 252/301.4 S; 428/690, 917, 402, 323; 313/502, 503, 504, 506, 112, 116; 427/66; 445/24

(56) References Cited

U.S. PATENT DOCUMENTS

| | | | |
|---|---|---|---|
| 4,617,195 A | * | 10/1986 | Mental ........................ 313/503 |
| 5,294,870 A | | 3/1994 | Tang et al. ................... 313/504 |
| 5,717,289 A | * | 2/1998 | Tanaka ........................ 313/503 |
| 5,909,081 A | * | 6/1999 | Eida et al. .................... 313/504 |
| 5,955,837 A | * | 9/1999 | Horikx et al. ................ 313/506 |
| 6,181,062 B1 | * | 1/2001 | Hiraishi et al. .............. 313/504 |
| 6,252,254 B1 | * | 6/2001 | Soules et al. ................. 313/503 |
| 6,255,670 B1 | * | 7/2001 | Srivastava et al. ........... 313/503 |
| 6,259,204 B1 | * | 7/2001 | Ebisawa et al. .............. 313/504 |

FOREIGN PATENT DOCUMENTS

| | | | |
|---|---|---|---|
| EP | 0809420 | 11/1997 | |
| GB | 2333897 A | 4/1999 | |
| JP | 08222372 A | * 8/1996 | ........... H05B/33/14 |
| JP | 10154830 | 9/1998 | |
| JP | 10022073 | 4/1999 | |
| JP | 11067451 | 9/1999 | |

OTHER PUBLICATIONS

Junji Kido et al., "Multilayer White Light-Emitting Organic Electroluminescent Device", 267 Science 1332–1334 (1995).

Robert A. Myers (Ed.), "Encyclopedia of Physical Science and Technology", vol. 7, 224–257 (1987).

(List continued on next page.)

Primary Examiner—Nimeshkumar D. Patel
Assistant Examiner—Mariceli Santiago
(74) Attorney, Agent, or Firm—Toan P. Vo; Patrick K. Patnode

(57) ABSTRACT

A light source comprises an organic light emitting device which emits radiation having a first spectrum and a phosphor layer which absorbs a portion of the light emitted by the organic light emitting layer and which emits light having a second spectrum. The phosphor layer typically absorbs less than all of the light emitted by the organic light emitting layer and typically covers the entire organic light emitting device. The light emitted by the organic light emitting layer is mixed with the light emitted by the phosphor layer to produce light having a third spectrum. Exemplary embodiments of the invention provide advantages over known devices. For example, because a phosphor layer is provided, the light emitted from the organic light emitting device is scattered, which provides improved uniformity in light output over the area of the light source. Also, because most phosphors are relatively stable over time, the light source has good color stability over time.

30 Claims, 4 Drawing Sheets

OTHER PUBLICATIONS

R. H. Friend, 4 J. Molecular Electronics 37–46 (1988).

Gerrit Klarner et al., "Colorfast Blue Light Emitting Random Copolymers Derived From Di–n–Hexylfluorene and Anthracene", 10 Adv. Mater. 993–997 (1998).

Chung–Chih Wu et al., " Efficient Organic Electroluminescent Devices Using Single–Layer Doped Polymer Thin Films With Bipolar Carrier Transport Abilities", 44 IEEE Trans.on Elec. Devices 1269–1281 (1997).

A.W. Grice et al., "High Brightness and Efficiency of Blue Light–Emitting Polymer Diodes", 73 Appl. Phys. Letters 629–631 (1998).

Hiroyuli Suzuki et al., "Near–Ultraviolet Electroluminescence From Polysilanes", 331 Thin Solid Films 64–70 (1998).

Gunter Wyszecki and W. S. Stiles, "Color Science: Concepts and Methods, Quantitative Data and Formulae", pp. 173–179, John Wiley & Sons, Inc. (1982).

* cited by examiner

LIGHT SOURCE WITH ORGANIC LAYER AND PHOTOLUMINESCENT LAYER

This application claims the benefit of U.S Provisional Application No. 60/178,451, filed Jan. 27, 2000 and U.S. Provisional Application No. 60/194,068, filed Mar. 31, 2000.

BACKGROUND OF THE INVENTION

1. Field of the Invention

The present invention relates generally to lighting applications, and more particularly to a light source comprising an organic light emitting device combined with a layer of photoluminescent material which may have a relatively large area.

2. Description of the Related Art

There are many examples of lighting devices which comprise inorganic light emitting diodes (LEDs) or organic light emitting devices (OLEDs). One example is the commercially available blue inorganic gallium nitride (GaN) LEDs which are coated with phosphor particles to produce white light. These LEDs are essentially point sources of light rather than extended sources of light.

An example of an OLED is set forth in U.S. Pat. No. 5,294,870, which describes an organic electroluminescent multicolor display device comprising an organic electroluminescent source emitting blue light with green-and red-emitting fluorescent materials applied to different subpixel areas. This device emits different colors from the different subpixel areas by color shifting with the green- and red-emitting fluorescent materials.

Another example of an OLED is described in Junji Kido et al., "Multilayer White Light-Emitting Organic Electroluminescent Device", 267 Science 1332–1334 (1995). This device includes three emitter layers with different carrier transport properties, each emitting blue, green, or red light, which layers are used to generate white light. In this device, however, the layers emitting the different colors typically degrade over time at different rates. Consequently, the color of the device is likely to change over time. In addition, the uniformity of the light output over the emitting area of the device may be less than desirable.

BRIEF SUMMARY OF THE INVENTION

A light source, according to one aspect of the invention, comprises an organic light emitting device which emits light having a first spectrum and a layer of photoluminescent material which absorbs a portion of the light emitted by the organic light emitting layer and which emits light having a second spectrum. The layer of photoluminescent material, which may comprise an inorganic phosphor, typically absorbs less than all of the light emitted by the organic light emitting layer. The light emitted by the organic light emitting layer is mixed with the light emitted by the photoluminescent material to produce light having a third spectrum.

Exemplary embodiments of the invention provide advantages over known devices. For example, if a phosphor is used as the photoluminescent layer, the light emitted from the organic light emitting device is scattered, which provides improved uniformity in light output over the area of the light source. Also, because most phosphors are relatively stable over time, the light source according to exemplary embodiments of the invention has good color stability over time.

BRIEF DESCRIPTION OF THE DRAWINGS

Other features and advantages of the invention will be apparent from the following detailed description of preferred embodiments and the accompanying drawings, in which.

DETAILED DESCRIPTION OF THE INVENTION

For general illumination applications, it is often desirable to have a thin, flat, inexpensive, extended white light source with a high color rendition index (CRI) and a color temperature in the range of 3000–6500° K.

The color temperature of a light source refers to the temperature of a blackbody source having the closest color match to the light source in question. The color match is typically represented and compared on a conventional CIE (Commission International de l'Eclairage) chromaticity diagram. See, for example, "Encyclopedia of Physical Science and Technology", vol. 7, 230–231 (Robert A. Meyers ed., 1987). Generally, as the color temperature increases, the light becomes more blue. As the color temperature decreases, the light appears more red.

The color rendering index (CRI) is a measure of the degree of distortion in the apparent colors of a set of standard pigments when measured with the light source in question as opposed to a standard light source. The CRI can be determined by calculating the color shift, e.g. quantified as tristimulus values, produced by the light source in question as opposed to the standard light source. Typically, for color temperatures below 5000° K., the standard light source used is a blackbody of the appropriate temperature. For color temperatures greater than 5000° K., sunlight is typically used as the standard light source. Light sources having a relatively continuous output spectrum, such as incandescent lamps, typically have a high CRI, e.g. equal to or near 100. Light sources having a multi-line output spectrum, such as high pressure discharge lamps, typically have a CRI ranging from about 50 to 80. Fluorescent lamps typically have a CRI greater than about 60.

According to exemplary embodiments of the invention, the light source comprises an organic light emitting device which emits light in the blue or ultraviolet (UV) spectral region combined with a coating of photoluminescent material such as phosphor particles. The photoluminescent materials, e.g. phosphor particles, are typically chosen such that they absorb the blue or UV light emitted from the organic light emitting device and re-emit light at longer wavelengths. The particle size of the phosphor particles is typically chosen to allow enough light scattering to effectively mix the light re-emitted from the phosphors with the blue or UV light that is not absorbed by the phosphors to provide good color mixing so that the final color of the light emitted by the device is homogeneous. In addition, the phosphor particle absorption and emission spectral characteristics and intensities are typically chosen such that the combination spectrum consisting of the non-absorbed light along with the phosphor-emitted light provides white light, e.g. in the color range of 3000–6500° K. with a CRI greater than 60.

Figure 9:
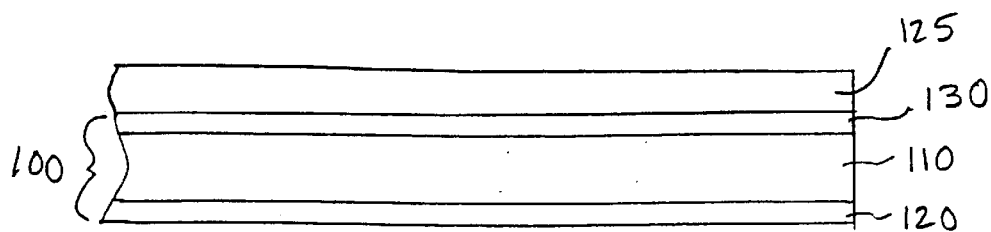
FIG. 9 is a drawing of an organic light emitting device according to an exemplary embodiment of the invention.

FIG. 9 illustrates the structure of a typical organic light emitting device. The organic light emitting device 100 includes an organic light emitting layer 110 disposed between two electrodes, e.g., a cathode 120 and an anode 130. The organic light emitting layer 110 emits light upon application of a voltage across the anode and cathode. The term "organic light emitting device" generally refers to the combination of the organic light emitting layer, the cathode, and the anode. The organic light emitting device 100 may be formed on a substrate 125, such as glass or transparent plastics such as PET (MYLAR), polycarbonate, and the like, as shown in FIG. 9.

The anode and cathode inject charge carriers, i.e. holes and, electrons, into the organic light emitting layer 110 where they recombine to form excited molecules or excitons which emit light when the molecules or excitons decay. The color of light emitted by the molecules depends on the energy difference between the excited state and the ground state of the molecules or excitons. Typically, the applied voltage is about 3–10 volts but can be up to 30 volts or more, and the external quantum efficiency (photons out/electrons in) is between 0.01% and 5%, but could be up to 10%, 20%, 30%, or more. The organic light emitting layer 110 typically has a thickness of about 50–500 nanometers, and the electrodes 120, 130 each typically have a thickness of about 100–1000 nanometers.

The cathode 120 generally comprises a material having a low work function value such that a relatively small voltage causes emission of electrons from the cathode. The cathode 120 may comprise, for example, calcium or a metal such as gold, indium, manganese, tin, lead, aluminum, silver, magnesium, or a magnesium/silver alloy. Alternatively, the cathode can be made of two layers to enhance electron injection. Examples include a thin inner layer of LiF followed by a thicker outer layer of aluminum or silver, or a thin inner layer of calcium followed by a thicker outer layer of aluminum or silver.

The anode 130 typically comprises a material having a high work function value. The anode 130 is preferably transparent so that light generated in the organic light emitting layer 110 can propagate out of the organic light emitting device 100. The anode 130 may comprise, for example, indium tin oxide (ITO), tin oxide, nickel, or gold. The electrodes 120, 130 can be formed by conventional vapor deposition techniques, such as evaporation or sputtering, for example.

A variety of organic light emitting layers 110 can be used in conjunction with exemplary embodiments of the invention. According to one embodiment shown in FIG. 9, the organic light emitting layer 110 comprises a single layer. The organic light emitting layer 110 may comprise, for example, a conjugated polymer which is luminescent, a hole-transporting polymer doped with electron transport molecules and a luminescent material, or an inert polymer doped with hole transporting molecules and a luminescent material. The organic light emitting layer 110 may also comprise an amorphous film of luminescent small organic molecules which can be doped with other luminescent molecules.

According to other embodiments of the invention shown in FIGS. 10–13, the organic light emitting layer 110 comprises two or more sublayers which carry out the functions of hole injection, hole transport, electron injection, electron transport, and luminescence. Only the luminescent layer is required for a functioning device. However, the additional sublayers generally increase the efficiency with which holes and electrons recombine to produce light. Thus the organic light emitting layer 110 can comprise 1–4 sublayers including, for example, a hole injection sublayer, a hole transport sublayer, a luminescent sublayer, and an electron injection sublayer. Also, one or more sublayers may comprise a material which achieves two or more functions such as hole injection, hole transport, electron injection, electron transport, and luminescence.

Embodiments in which the organic light emitting layer 110 comprises a single layer, as shown in FIG. 9, will now be described.

According to one embodiment, the organic light emitting layer 110 comprises a conjugated polymer. The term conjugated polymer refers to a polymer which includes a delocalized π-electron system along the backbone of the polymer. The delocalized π-electron system provides semiconducting properties to the polymer and gives it the ability to support positive and negative charge carriers with high mobilities along the polymer chain. The polymer film has a sufficiently low concentration of extrinsic charge carriers that on applying an electric field between the electrodes, charge carriers are injected into the polymer and radiation is emitted from the polymer. Conjugated polymers are discussed, for example, in R. H. Friend, 4 Journal of Molecular Electronics 37–46 (:1988).

Examples of suitable conjugated polymers include polyfluorenes such as 2,7-substituted-9-substituted fluorenes and 9-substituted fluorene oligomers and polymers. Polyfluorenes generally have good thermal and chemical stability and high solid-state fluorescence quantum yields. The fluorenes, oligomers and polymers may be substituted at the 9-position with two hydrocarbyl moieties which may optionally contain one or more of sulfur, nitrogen, oxygen, phosphorous or silicon heteroatoms; a $C_{5-20}$ ring structure formed with the 9-carbon on the fluorene ring or a $C_{4-20}$ ring structure formed with the 9-carbon containing one or more heteroatoms of sulfur, nitrogen or oxygen; or a hydrocarbylidene moiety. According to one embodiment, the fluorenes are substituted at the 2- and 7-positions with aryl moieties which may further be substituted with moieties which are capable of crosslinking or chain extension or a trialkylsiloxy moiety. The fluorene polymers and oligomers may be substituted at the 2- and 7'-positions. The monomer units of the fluorene oligomers and polymers are bound to one another at the 2- and 7'-positions. The 2,7'-aryl-9-substituted fluorene oligomers and polymers may be further reacted with one another to form higher molecular weight polymers by causing the optional moieties on the terminal 2,7'-aryl moieties, which are capable of crosslinking or chain extension, to undergo chain extension or crosslinking.

The above described fluorenes and fluorene oligomers or polymers are readily soluble in common organic solvents. They are processable into thin films or coatings by conventional techniques such as spin coating, spray coating, dip coating and roller coating. Upon curing, such films demonstrate resistance to common organic solvents and high heat resistance. Additional information on such polyfluorenes is described in U.S. Pat. No. 5,708,130, which is hereby incorporated by reference.

Other suitable polyfluorenes which can be used in conjunction with exemplary embodiments of the invention include poly(fluorene) copolymers, such as poly(fluorene-co-anthracene)s, which exhibit blue electroluminescence. These copolymers include a polyfluorene subunit such as 2,7-dibromo-9,9-di-n-hexylfluorene (DHF) and another subunit such as 9,10-dibromoanthracene (ANT). High molecular weight copolymers from DHF and ANT can be prepared by the nickel-mediated copolymerization of the corresponding aryl dibromides. The final polymer molecular weight can be controlled by adding the end capping reagent 2-bromofluorene at different stages of the polymerization. The copolymers are thermally stable with decomposition temperatures above 400° C. and are soluble in common organic solvents such as tetrahydrofuran (THF), chloroform, xylene, or chlorobenzene. They emit blue light having a wavelength of about 455 nm. Additional information on such polyfluorenes is described in Gerrit Klarner et al., "Colorfast Blue Light Emitting Random Copolymers Derived from Di-n-hexylfluorene and Anthracene", 10 Adv. Mater. 993–997 (1998), which is hereby incorporated by reference.

Figure 10:
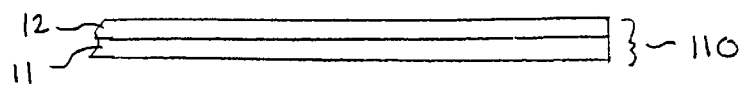
FIG. 10 shows an embodiment of the present invention wherein the organic light emitting layer includes a luminescent sublayer and a hole injection sublayer.

According to another embodiment of the invention shown in FIG. 10, the organic light emitting layer 110 comprises two sublayers. The first sublayer 11 provides hole transport, electron transport, and luminescent properties and is positioned adjacent the cathode 120. The second sublayer 12 serves as a hole injection sublayer and is positioned adjacent the anode 130. The first sublayer 11 comprises a hole-transporting polymer doped with electron transporting molecules and a luminescent material, e.g. a dye or polymer. The hole-transporting polymer may comprise poly(N-vinylcarbazole) (PVK), for example. The electron transport molecules may comprise 2-(4-biphenyl)-5-(4-tert-butylphenyl)-1,3,4-oxadiazole (PBD), for example. The luminescent material typically comprises small molecules or polymers which act as emitting centers to vary the emission color. For example, the luminescent materials may comprise the organic dye coumarin 460, which has a blue emission. Thin films of these blends can be formed by spin coating a chloroform solution containing different amounts of PVK, electron transport molecules, and luminescent materials. For example, a suitable mixture comprises 100 weight percent PVK, 40 weight percent PBD, and 0.2–1.0 weight percent organic dye.

The second sublayer 12 serves as a hole injection sublayer and may comprise poly(3,4)ethylenedioxythiophene/ polystyrenesulphonate (PEDT/PSS), for example, available from Bayer Corporation, which can be applied by conventional methods such as spin coating. Additional information on hole-transporting polymers doped with electron transporting molecules and a luminescent material is described in Chung-Chih Wu et al., "Efficient Organic Electroluminescent Devices Using Single-Layer Doped Polymer Thin Films with Bipolar Carrier Transport Abilities", 44 IEEE Trans. on Elec. Devices 1269–1281 (1997), which is hereby incorporated by reference.

Figure 11:
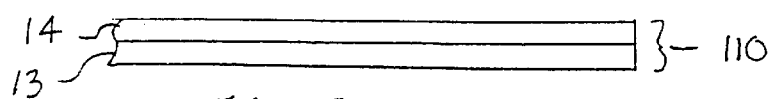
FIG. 11 shows an embodiment of the present invention wherein the organic light emitting layer includes a luminescent sublayer and a hole transporting sublayer.

According to another embodiment of the invention shown in FIG. 11, the organic light emitting layer 110 includes a first sublayer 13 comprising a luminescent sublayer and a second sublayer 14 comprising a hole transporting sublayer. The hole transporting sublayer 14 may comprise an aromatic amine that is readily and reversibly oxidizable, for example. One example of such a luminescent sublayer and a hole transporting sublayer is described in A. W. Grice et al, "High Brightness and Efficiency of Blue Light-Emitting Polymer Diodes", 73 Appl. Phys. Letters 629–631 (1998), which is hereby incorporated by reference. The device described therein comprises two polymer layers sandwiched between an ITO electrode and a calcium electrode. The polymer layer next to the ITO is a hole transport layer and comprises a polymeric triphenyldiamine derivative (poly-TPD). The blue emitting polymer layer which is next to the calcium electrode is poly(9,9-dioctylfluorene).

Figure 12:
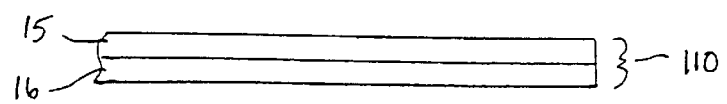
FIG. 12 shows an embodiment of the present invention wherein the organic light emitting layer includes a luminescent sublayer and an electron injection sublayer.

According to another embodiment of the invention shown in FIG. 12, the organic light emitting layer 110 comprises a first sublayer 15 which includes luminescent and hole transport properties, and a second sublayer 16 which includes electron injection properties. The first sublayer 15 comprises a polysilane, and the second sublayer comprises an oxadiazole compound. This structure produces ultraviolet (UV) light.

Polysilanes are linear silicon (Si)-backbone polymers substituted with a variety of alkyl and/or aryl side groups. In contrast to π-conjugated polymers, polysilanes are quasi one-dimensional materials with delocalized σ-conjugated electrons along the polymer backbone chain. Due to their one-dimensional direct-gap nature, polysilanes exhibit a sharp photoluminescence with a high quantum efficiency in the ultraviolet region. Examples of suitable polysilanes include poly(di-n-butylsilane) (PDBS), poly(di-n-pentylsilane) (PDPS), poly(di-n-hexylsilane) (PDHS), poly (methyl-phenylsilane) (PMPS), and poly[-bis(p-butylphenyl)silane] (PBPS). The polysilane sublayer 15 can be applied by spin coating from a toluene solution, for example. The electron injection sublayer 16 may comprise 2,5-bis(4-biphenyl)-1,3,4-oxadiazole (BBD), for example. Additional information on UV-emitting polysilane organic light emitting layers is described in Hiroyuki Suzuki et al, "Near-ultraviolet Electroluminescence from Polysilanes", 331 Thin Solid Films 64–70 (1998), which is hereby incorporated by reference.

Figure 13:
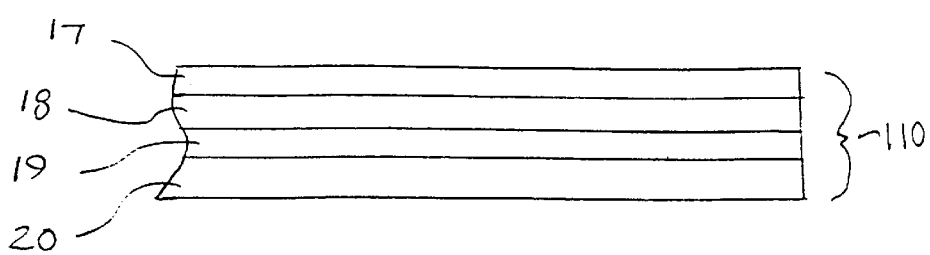
FIG. 13 shows an embodiment of the present invention wherein the organic light emitting layer includes a hole injecting sublayer, a hole transporting sublayer, a luminescent sublayer, and an electron injecting sublayer.

According to another embodiment of the invention shown in FIG. 13, the organic light emitting layer 110 comprises a hole injecting sublayer 17, a hole transporting sublayer 18, a luminescent sublayer 19, and an electron injecting sublayer 20. The hole injecting sublayer 17 and hole transporting sublayer 18 efficiently provide holes to the recombination area. The electrode injecting sublayer 20 efficiently provides electrons to the recombination area.

The hole injecting sublayer 17 may comprise a porphyrinic compound, such as a metal free phthalocyanine or a metal containing phthalocyanine, for example. The hole transporting sublayer 18 may comprise a hole transporting aromatic tertiary amine, where the latter is a compound containing at least one trivalent nitrogen atom that is bonded only to carbon atoms, at least one of which is a member of an aromatic ring. The luminescent sublayer 19 may comprise, for example, a mixed ligand aluminum chelate emitting in the blue wavelengths, such as bis(R-8-quinolinolato)-(phenolato)aluminum(III) chelate where R is a ring substituent of the 8-quinolinolato ring nucleus chosen to block the attachment of more than two 8-quinolinolato ligands to the aluminum atom. The electron injection sublayer 20 may comprise a metal oxinoid charge accepting compound such as a tris-chelate of aluminum. Additional information on such four-layer materials and devices are described in U.S. Pat. No. 5,294,870, which is hereby incorporated by reference.

The above examples of organic light emitting layers 110 can be used to design a light emitting device which emits in one or more desired colors. For example, the light emitting device 135 can emit ultraviolet light as well as blue light. Other colors such as red and green can be produced, but may be less desirable for the production of white light.

Figure 1:
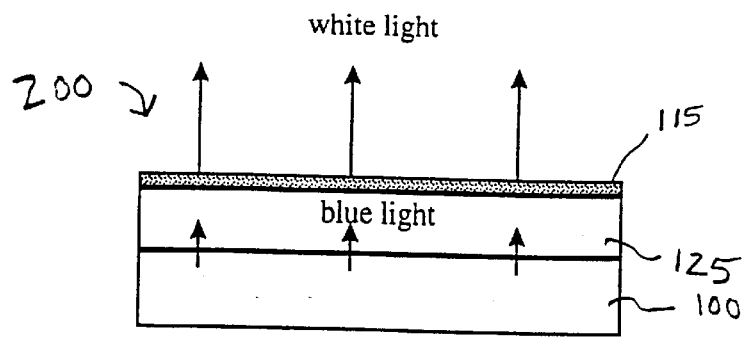
FIG. 1 illustrates an embodiment of the present invention wherein a phosphor layer is disposed on the substrate.

Referring to FIG. 1, a light source 200 is depicted according to one embodiment of the invention. The term "light source" generally refers to an organic light emitting device 100 in combination with a photoluminescent layer. As shown in FIG. 1, the phosphor particles are deposited as a photoluminescent layer 115 onto the transparent substrate 125. A fraction of the light from the organic light emitting device 100 is absorbed by the phosphor particles and re-emitted at longer wavelengths. The longer wavelength light mixes with the unabsorbed blue or UV light through scattering in the phosphor particle layer 115 such that the emitted light is homogeneous and white. Typically, the phosphor layer 115 absorbs about 30–90% of the light emitted by the organic light emitting device 100. This percentage is generally chosen based on the spectra of the organic light emitting device and the phosphor, the quantum efficiency of the phosphor, and the desired color.

Figure 2:
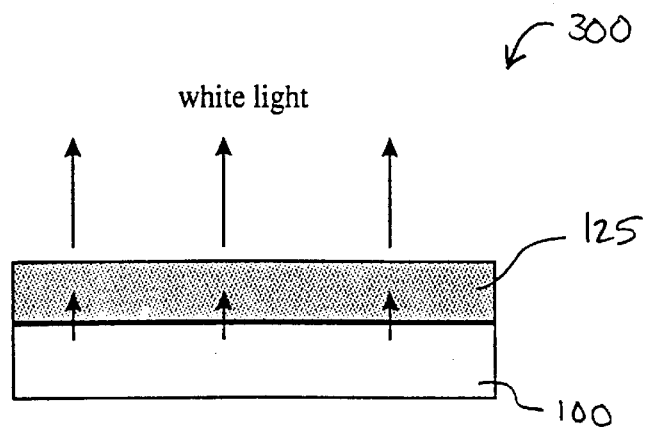
FIG. 2 illustrates another embodiment of the present invention wherein the phosphor particles are embedded in the substrate.

FIG. 2 depicts another embodiment of a light source 300 where the phosphor powder particles are added into the transparent or partially transparent substrate 125, onto which the organic light emitting device 100 is made. Substrate materials into which phosphor particles can be added include glass and transparent plastics such as PET (MYLAR), polycarbonate, and other thermoplastic materials.

For both of the embodiments of FIGS. 1 and 2, scattering particles such as $TiO_2$ or $SiO_2$ particles can be added into the phosphor powder mix in order to aid in the color mixing and the brightness uniformity over the emitting area of the light source. In addition, FIG. 3 illustrates another embodiment of a light source 400 in which a separate layer 135 of scattering particles is provided above the phosphor powder layer 125 to provide enhanced color mixing.

Figure 3:
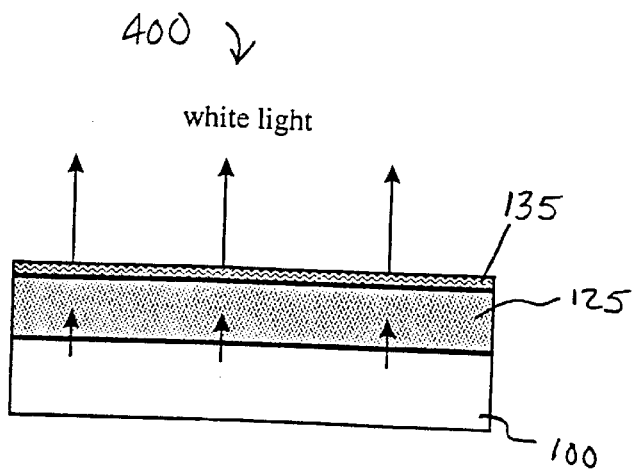
FIG. 3 illustrates another embodiment of the present invention wherein a light scattering layer is disposed on the phosphor layer.

Typically, the emitting area of the organic light emitting device 100 is roughly coincident with the area of the phosphor layer and the area of the layer of scattering particles, as shown in FIGS. 1–3. For example, the emitting area of the organic light emitting device 100 may be a 3 cm×3 cm square, and the phosphor layer and layer of scattering particles may have about the same area in shape and value (e.g. 75–125% of the emitting area of the organic light emitting device). Typically, the emitting area of the organic light emitting device 100, the phosphor layer, and the layer of scattering particles are all planar and parallel, as shown in FIGS. 1–3. The area of the phosphor layer is typically at least as large as the emitting area of the organic light emitting device.

The following example describes a blue organic light emitting device 100 which can be used in conjunction with exemplary embodiments of the invention.

EXAMPLE

Figure 4:
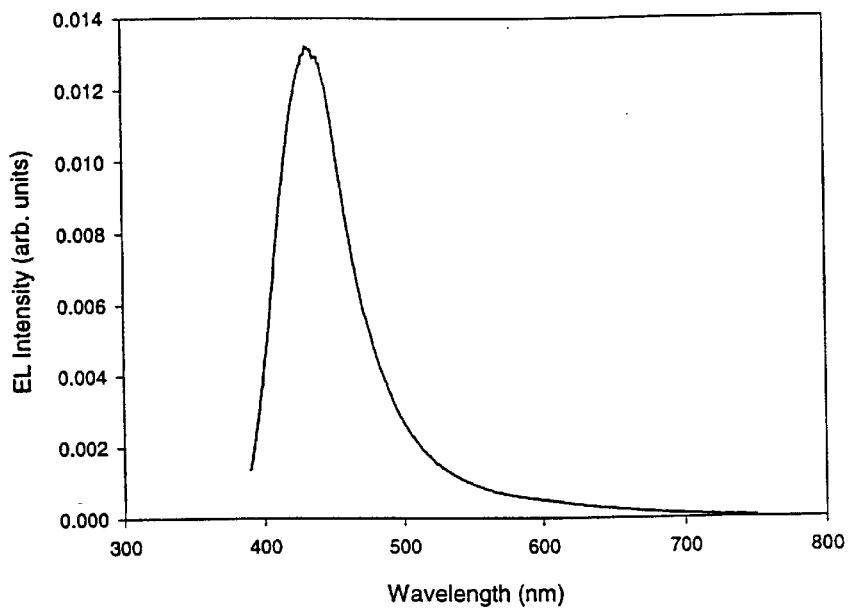
FIG. 4 is a graph of the electroluminescence spectrum of an organic light emitting device according an exemplary embodiment of the invention.

A blue-emitting organic light emitting device was constructed as follows. Indium tin oxide (ITO) coated glass (15 ohm-square) was obtained from Applied Films Corporation and portions of it were etched away using the vapors of aqua regia. This substrate was then mechanically cleaned with a detergent, soaked in a methanol solution followed by a boiling isopropyl alcohol solution, and finally placed in an ozone cleaner for 5 minutes. An approximately 5 nanometer (nm) layer of poly(3,4)ethylenedioxythiophene/polystyrenesulphonate (PEDT/PSS) from Bayer Corporation was then spin coated onto the ITO. Approximately 100 nm of a polymer blend consisting of poly(9-vinyl carbazole) (PVK) from Aldrich Co., 2-(4-biphenylyl)-5-(4-tert-butyl-phenyl)-1,3,4-oxadiazole (PBD) from Aldrich Co., and 7-Diethylamino-4-methylcoumarin (Coumarin 460) from Exciton Co. with weight percent ratios of 100:40:1 was then spin coated onto the PEDT layer using dichloroethane as the solvent. Next, a cathode consisting of an approximately 0.8 nm layer of lithium fluoride followed by about 100 nm of aluminum was evaporated onto the device through a shadow-mask to define a cathode pattern. The device was then transferred to a glove box and a glass slide was attached to the cathode side of the device with epoxy in order to provide encapsulation. The resulting device emitted blue light upon application of a voltage. The blue emission spectrum for this device is shown in FIG. 4.

As described above, the light source includes a layer of photoluminescent material which absorbs light from the organic light emitting layer and emits light typically having a longer wavelength. The photoluminescent material typically comprises an inorganic phosphor, but may also comprise an organic photoluminescent material such as an organic dye. According to exemplary embodiments of the invention, a phosphor material absorbs blue light from the organic light emitting device 100 and re-emits the light at lower wavelengths such that color temperatures in the range of 3000–6500° K. are achieved with good color rendering properties.

Examples of phosphor materials that can be utilized include those Aphosphors based on cerium doped into a $Y_3Al_5O_{12}$ (YAG) lattice which crystallizes in the garnet structure. Specific examples include $(Y_{1-x-y}Gd_xCe_y)_3Al_5O_{12}$ (YAG:Gd,Ce), $(Y_{1-x}Ce_x)_3Al_5O_{12}$ (YAG:Ce), $(Y_{1-x}Ce_x)_3(Al_{1-y}Ga_y)_5O_{12}$ (YAG:Ga,Ce) and $(Y_{1-x-y}Gd_xCe_y)_3(Al_{5-z}Ga_z)_5O_{12}$ (YAG:Gd,Ga,Ce) and $(Gd_{1-x}Ce_x)Sc_2Al_3O_{12}$ (GSAG). The YAG phosphors can be described generally as $(Y_{1-x-y}Gd_xCe_y)_3(Al_{1-z}Ga_z)_5O_{12}$, wherein $x+y \leq 1$; $0 \leq x \leq 1$; $0<y \leq 1$; and $0 \leq z \leq 1$. The position of the peak of the emission band varies considerably in the aforementioned phosphors. Depending on the garnet composition, the $Ce^{3+}$ emission can be tuned from the green (~540 nm; YAG:Ga,Ce) to the red (~600 nm; YAG:Gd:Ce) without appreciable loss in the luminescence efficiency. An appropriate phosphor material or blend of phosphor materials in combination with the visible (blue) emission of the organic light emitting device 100 can thus produce a white field corresponding to a wide range of color temperatures. Light sources in the form of large area white light electroluminescent panels which closely approximate the color, CRI, and brightness of conventional fluorescent lamps can be made with such phosphors and organic light emitting devices. Examples of suitable combinations of color temperature and CRI include 3000–4500° K. with a CRI of at least 60 or 70 or more; 4500–5500° K. with a CRI of at least 60 or 70 or more; and 5500–6500° K. with a CRI of at least 60 or 70 or more.

Figure 5:
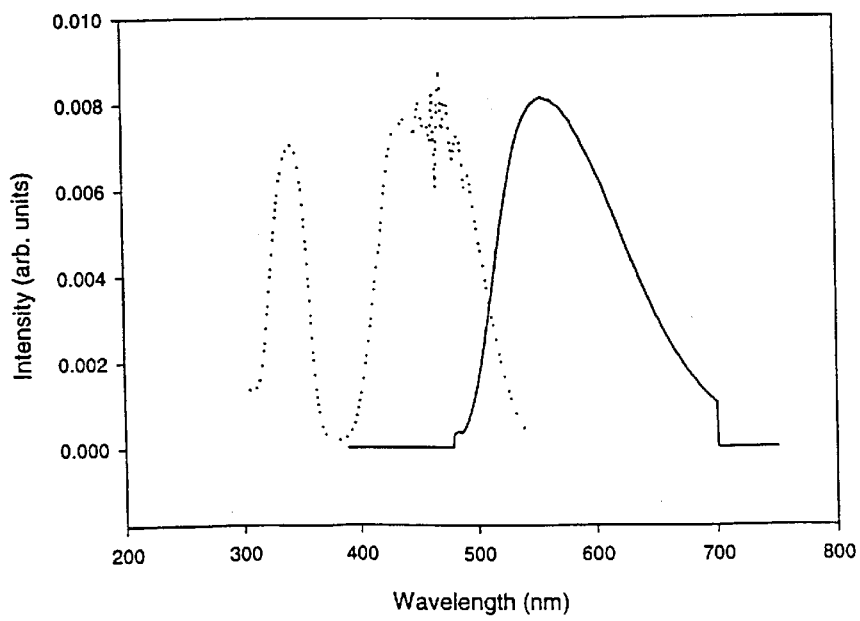
FIG. 5 is a graph of the excitation and emission spectra of the YAG:Ce phosphor according to an exemplary embodiment of the invention.
Figure 6:
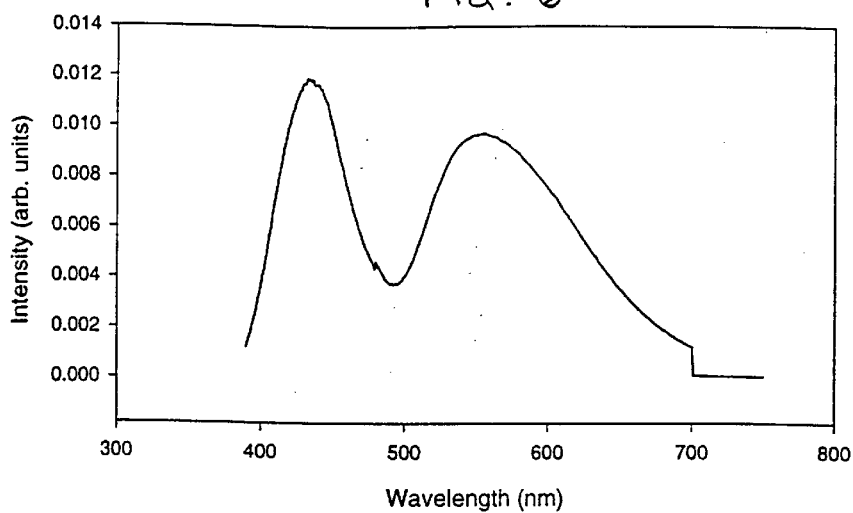
FIG. 6 shows the calculated composite spectrum of light-emitting organic PVK:PBD:coumarin 460 and YAG:Ce phosphor.

FIG. 5 is a graph of the excitation (dotted line) and emission (solid line) spectrum of YAG:Ce having the following composition: $(Y_{0.97}Ce_{0.03})_3Al_5O_{12}$. The output spectrum for a light source (organic light emitting device plus phosphor) can be estimated by summing the individual spectra of the blue-emitting organic light emitting device and the phosphor emission spectra. FIG. 6 shows an example of such an estimated spectrum for a light source comprising: 1) an organic light emitting device made according to the example above (PVK:PBD:Coumarin 460); and 2) the YAG:Ce phosphor (wherein the relative ratio of the integrated intensities of the blue spectrum over the phosphor spectrum is approximately 3). From the spectrum shown in FIG. 6, the correlated color temperature and CRI can be determined by methods known in the art. See, for example, Gunter Wyszecki and W. S. Stiles, "Color Science: Concepts and Methods, Quantitative Data and Formulae", John Wiley & Sons, Inc. (1982). By these known methods, the correlated color temperature and CRI were determined to be 6200° K. and 75, respectively for the spectrum of FIG. 6.

In general, for different applications, different color temperatures may be desired. Different color temperatures can be obtained with the same organic light emitting device/phosphor material combination by changing the relative ratio of the emitted blue light and the emitted phosphor light. This ratio may be changed, for example, by adjusting the thickness of the phosphor layer.

Figure 7:
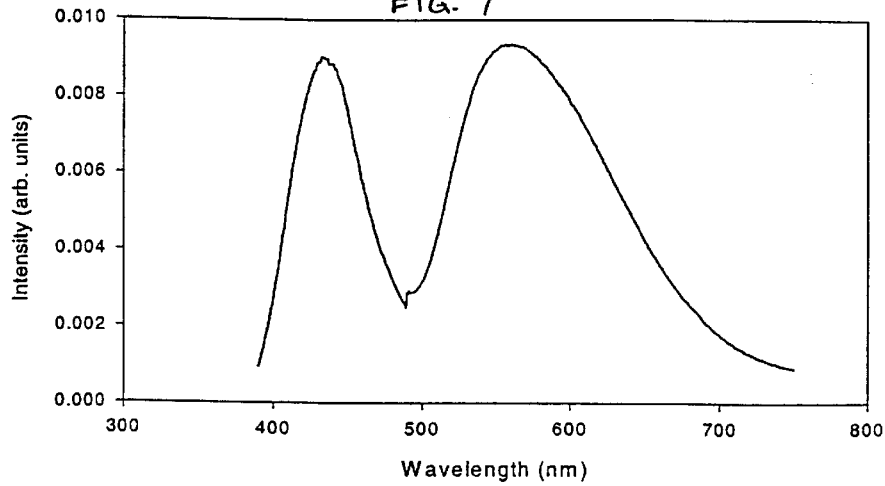
FIG. 7 shows the calculated composite spectrum of light-emitting organic PVK:PBD:coumarin 460 and $(Y_{0.77}Gd_{0.2}Ce_{0.03})_3Al_5O_{12}$ phosphor.

Alternatively, a different organic light emitting device/phosphor material system can be utilized. For example, FIG. 7 shows a calculated emission spectrum when the phosphor is changed from YAG:Ce to YAG:Gd,Ce having the following formula: $(Y_{0.77}Gd_{0.2}Ce_{0.03})_3Al_5O_{12}$. The organic light emitting device was the same as for FIG. 6 (PVK:PBD:Coumarin 460). The resulting color temperature and CRI were calculated to be 5000° K. and 74, respectively.

Figure 8:
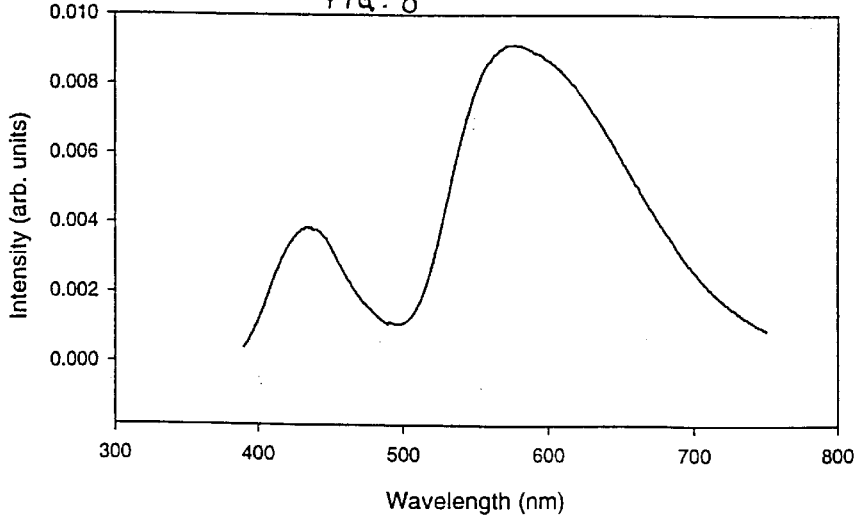
FIG. 8 shows the calculated composite spectrum of light-emitting organic PVK:PBD:coumarin 460 and $(Y_{0.77}Gd_{0.2}Ce_{0.03})_3Al_5O_{12}$ phosphor.

FIG. 8 shows a calculated emission spectrum when the phosphor is changed from YAG:Ce to YAG:Gd,Ce having the following formula: $(Y_{0.37}Gd_{0.6}Ce_{0.03})_3Al_5O_{12}$. The organic light emitting device was the same as for FIG. 6 (PVK:PBD:Coumarin 460). The resulting color temperature and CRI were calculated to be 3100° K. and 68, respectively. These calculations illustrate that a range of color temperatures, e.g. 3000–6500° K., with a high CRI, e.g. greater than 60 or 70, can be achieved in the organic light emitting device/phosphor system by changing the phosphor composition, in this case by changing the relative amount of Gd in the YAG:Gd,Ce phosphor.

In addition, more than one phosphor material may be combined together and then utilized with a blue organic light emitting device to achieve different colors, color temperatures, and color rendition indices. Other phosphors which can be used are described in U.S. Ser. No. 09/469,702, entitled "Luminescent Display and Method of Making", filed Dec. 22, 1999, in the name of Anil Duggal and Alok Srivastava, which is hereby incorporated by reference. An example of a suitable red emitting inorganic phosphor is $SrB_4O_7:Sm^{2+}$, where the $Sm^{2+}$ following the colon represents an activator. This phosphor absorbs most visible wavelengths shorter than 600 nm and emits light as a deep red line with a wavelength greater than 650 nm. An example of a suitable green emitting inorganic phosphor is $SrGa_2S_4:Eu^{2+}$. This phosphor absorbs below 500 nm and has a maximum emission at 535 nanometers. An example of a suitable blue emitting inorganic phosphor is $BaMg_2Al_{16}O_{27}:Eu^{2+}$. $BaMg_2Al_{16}O_{27}:Eu^{2+}$ absorbs most wavelengths below 430 nm and has a maximum emission at 450 nm. Examples of organic dyes which can be utilized in the photoluminescent layer include coumarin 460 (blue), coumarin 6 (green), and nile red.

Other embodiments of the invention will be apparent to those skilled in the art from a consideration of the embodiments disclosed herein. It is intended that the specification and examples be considered as exemplary only, with the scope and spirit of the invention being defined by the following claims.

What is claimed is:

1. A light source comprising:
   an organic light emitting device which emits light having a first spectrum; and
   a phosphor layer which absorbs a portion of light emitted by the organic light emitting device and which emits light having a second spectrum, wherein the portion of light absorbed by the phosphor layer is less than all of the light emitted by the organic light emitting device, and the phosphor layer further comprises scattering particles mixed into the phosphor layer.

2. The light source of claim 1, wherein the light emitted by the organic light emitting device is mixed with the light emitted by the phosphor layer to produce light having a third spectrum.

3. The light source of claim 1, wherein the organic light emitting device has an emitting surface with first area, the phosphor layer has a second area, and the first area is coincident with the second area.

4. The light source of claim 1, wherein the organic light emitting device has an emitting area, and the phosphor layer covers the entire emitting area of the organic light emitting device.

5. A light source comprising:
   an organic light emitting device which comprises an organic light emitting layer disposed between two electrodes, which organic light emitting device is disposed on a substrate and emits light having a first spectrum; and
   a phosphor layer which comprises a photoluminescent material and scattering particles, absorbs a portion of light emitted by the organic light emitting device, and emits light having a second spectrum, wherein the portion of light absorbed by the phosphor layer is less than all of the light emitted by the organic light emitting device, and the light emitted by the organic light emitting device is mixed with the light emitted by the phosphor layer to produce white light having a third spectrum.

6. The light source of claim 5, wherein the white light has a color temperature of 5500–6500° K.

7. The light source of claim 6, wherein the white light has a color rendering index of at least 60.

8. The light source of claim 5, wherein the white light has a color temperature of 4500–5500° K.

9. The light source of claim 8, wherein the white light has a color rendering index of at least 60.

10. The light source of claim 5, wherein the white light has a color temperature of 3000–4500° K.

11. The light source of claim 10, wherein the white light has a color rendering index of at least 60.

12. A light source comprising:
an organic light emitting device which comprises an organic light emitting layer disposed between two electrodes, which organic light emitting device is disposed on a substrate and emits light of a first wavelength; and
a planar photoluminescent layer comprising a photoluminescent material and scattering particles, the photoluminescent layer absorbing a portion of light emitted by the organic light emitting device and emitting light having a second wavelength, wherein the portion of light absorbed by the planar photoluminescent layer is less than all of the light emitted by the organic light emitting device, and the light source produces white light from a mix of light emitted by the organic light emitting device and light emitted by the planar photoluminescent layer.

13. The light source of claim 12, wherein the planar photoluminescent layer further comprises at least one inorganic phosphor.

14. The light source of claim 13, wherein each of the photoluminescent material and the at least one inorganic phosphor is embedded in a thermoplastic sheet.

15. The light source of claim 12, wherein the organic light emitting device has an emitting surface with an area of at least 9 square centimeters.

16. A light source comprising:
an organic light emitting device which emits light of a first wavelength; and
a planar photoluminescent layer which absorbs a portion of light emitted by the organic light emitting device and which emits light having a second wavelength, wherein the portion of light absorbed by the planar photoluminescent layer is less than all of the light emitted by the organic light emitting device, and the light emitted by the organic light emitting device mixes with the light emitted by the planar photoluminescent layer to produce white light, wherein the planar photoluminescent layer comprises at least one inorganic phosphor which comprises $(Y_{1-x-y}Gd_xCe_y)_{3(Al_{1-z}Ga_z)_5O_{12}}$, wherein $x+y \leq 1$; $0 \leq x \leq 1$; $0 \leq y \leq 1$; and $0 \leq z \leq 1$.

17. A light source comprising:
an organic light emitting device which comprises an organic light emitting layer disposed between two electrodes and emits light having a first spectrum;
a photoluminescent layer being in substantial contact with the organic light emitting device, the photoluminescent layer absorbing a portion of light emitted by the organic light emitting device and emitting light having a second spectrum, wherein the portion of light absorbed by the photoluminescent layer is less than all of the light emitted by the organic light emitting device; and
a scattering layer separate from the photoluminescent layer, the photoluminescent layer forming an only substrate on which the organic light emitting device is disposed, and the scattering layer scattering light emitted by the photoluminescent layer.

18. The light source of claim 17, wherein the photoluminescent layer comprises at least one inorganic phosphor, and the light emitted by the organic light emitting device mixes with the light emitted by the at least one inorganic phosphor to produce white light.

19. The light source of claim 17, wherein the scattering layer comprises at least one of $TiO_2$ and $SiO_2$ scattering particles.

20. The light source of claim 17, wherein the photoluminescent layer is formed in a planar configuration, and the scattering layer is formed in a planar configuration parallel to the photoluminescent layer.

21. A method of making a lighting device comprising the steps of:
forming an organic light emitting device which comprises an organic light emitting layer disposed between two electrodes; and
forming a layer of photoluminescent material, which comprises a photoluminescent material and scattering particles, on the organic light emitting device, which layer of photoluminescent material absorbs less than all of light emitted by the organic light emitting device;
wherein the lighting device produces white light from a mix of light emitted by the organic light emitting device and light emitted by the photoluminescent material.

22. The method of claim 21, wherein the photoluminescent material further comprises at least one inorganic phosphor.

23. The method of claim 22, wherein the at least one inorganic phosphor is formed in a planar configuration parallel to an emitting surface of the organic light emitting device.

24. The method of claim 23, wherein the photoluminescent material, the scattering particles, and the at least one inorganic phosphor is are encapsulated in a planar sheet comprising a thermoplastic.

25. The method of claim 21, wherein the layer of photoluminescent material forms an only substrate on which the organic light emitting device is disposed.

26. The method of claim 25, wherein the layer of photoluminescent material is formed in a planar configuration parallel to the organic light emitting device.

27. A method of making a lighting device comprising the steps of:
forming an organic light emitting device which comprises an organic light emitting layer disposed between two electrodes and is supported on a substrate; and
forming a layer of photoluminescent material, which comprises a photoluminescent material and scattering particles, on the organic light emitting device, which layer of photoluminescent material absorbs less than all of light emitted by the organic light emitting device;
wherein the light emitted by the organic light emitting device mixes with light emitted by the photoluminescent material to produce white light, and the step of forming a layer of photoluminescent material comprises selecting the photoluminescent material such that a color temperature of the white light is 5500–6500° K.

28. A method of making a lighting device comprising the steps of:
forming an organic light emitting device which comprises an organic light emitting layer disposed between two electrodes and is supported on a substrate; and
forming a layer of photoluminescent material, which comprises a photoluminescent material and scattering particles, on the organic light emitting device, which layer of photoluminescent material absorbs less than all of light emitted by the organic light emitting device;
wherein the light emitted by the organic light emitting device mixes with light emitted by the photoluminescent material to produce white light, and the step of forming a layer of photoluminescent material comprises selecting the photoluminescent material such that a color temperature of the white light is 4500–5500° K.

29. A method of making a lighting device comprising the steps of:

forming an organic light emitting device which comprises an organic light emitting layer disposed between two electrodes and is supported on a substrate; and forming a layer of photoluminescent material, which comprises a photoluminescent material and scattering particles, on the organic light emitting device, which layer of photoluminescent material absorbs less than all of light emitted by the organic light emitting device;

wherein the light emitted by the organic light emitting device mixes with light emitted by the photoluminescent material to produce white light, and the step of forming a layer of photoluminescent material comprises selecting the photoluminescent material such that a color temperature of the white light is 3000–4500° K.

30. A light source comprising:

an organic light emitting device which comprises an organic light emitting layer disposed between two electrodes, and emits light having a first spectrum; and a phosphor layer being disposed on the organic light emitting device so as to leave no substantial gap therebetween, and forming an only substrate for the organic light emitting device, the phosphor layer absorbing a portion of light emitted by the organic light emitting device and emitting light having a second spectrum, wherein the portion of light absorbed by the phosphor layer is less than all of the light emitted by the organic light emitting device.

* * * * *